(12) United States Patent
Bauerle

(10) Patent No.: US 10,639,869 B2
(45) Date of Patent: *May 5, 2020

(54) VEHICULAR LUMINOUS LAMINATED GLAZED ROOF, VEHICLE INCORPORATING SAME AND MANUFACTURE

(71) Applicant: SAINT-GOBAIN GLASS FRANCE, Courbevoie (FR)

(72) Inventor: Pascal Bauerle, Roye (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/304,491

(22) PCT Filed: May 24, 2017

(86) PCT No.: PCT/FR2017/051286
§ 371 (c)(1),
(2) Date: Nov. 26, 2018

(87) PCT Pub. No.: WO2017/203170
PCT Pub. Date: Nov. 30, 2017

(65) Prior Publication Data
US 2019/0193376 A1    Jun. 27, 2019

(30) Foreign Application Priority Data
May 26, 2016   (FR) ...................................... 16 00850

(51) Int. Cl.
*B32B 17/06* (2006.01)
*B60Q 3/14* (2017.01)
(Continued)

(52) U.S. Cl.
CPC ........ *B32B 17/10293* (2013.01); *B32B 3/266* (2013.01); *B32B 3/30* (2013.01);
(Continued)

(58) Field of Classification Search
CPC .................... B32B 17/10541; B32B 17/10761
See application file for complete search history.

(56) References Cited

U.S. PATENT DOCUMENTS 5,059,254 A * 10/1991 Yaba ................ B32B 17/10018
136/244
2005/0238857 A1* 10/2005 Day .................. B32B 17/10045
428/209
(Continued)

FOREIGN PATENT DOCUMENTS

EP        0 844 075 A1      5/1998
WO   WO 2007/045786 A1     4/2007
(Continued)

OTHER PUBLICATIONS

International Search Report as issued in International Patent Application No. PCT/FR2017/051286, dated Aug. 29, 2017.

*Primary Examiner* — Evan P Dzierzynski
*Assistant Examiner* — Keith G. Delahoussaye
(74) *Attorney, Agent, or Firm* — Pillsbury Winthrop Shaw Pittman LLP

(57) ABSTRACT

A laminated glazed roof includes a first glazing, forming an exterior glazing, with first and second main faces; a lamination interlayer made of polymeric material of thickness e1 of at most 1.8 mm; a second glazing, forming an interior glazing, with third and fourth main faces, the second and third main faces being the internal faces of the laminated glazing; and a set of diodes that are housed in through apertures or blind holes of the lamination interlayer.

20 Claims, 8 Drawing Sheets

(51) Int. Cl.
  B60Q 3/20    (2017.01)
  B32B 17/10   (2006.01)
  B60Q 3/208   (2017.01)
  B60Q 3/76    (2017.01)
  B60Q 9/00    (2006.01)
  B62D 25/06   (2006.01)
  B60Q 3/80    (2017.01)
  B32B 3/26    (2006.01)
  B32B 3/30    (2006.01)
  B32B 37/18   (2006.01)
  B32B 38/00   (2006.01)
  B60Q 1/00    (2006.01)
  B60Q 1/26    (2006.01)
  H01L 33/54   (2010.01)
  H01L 33/62   (2010.01)
  H01L 25/13   (2006.01)
  H01L 33/60   (2010.01)

(52) U.S. Cl.
  CPC .. *B32B 17/10036* (2013.01); *B32B 17/10541* (2013.01); *B32B 17/10761* (2013.01); *B32B 17/10935* (2013.01); *B32B 37/182* (2013.01); *B32B 38/0004* (2013.01); *B60Q 1/0076* (2013.01); *B60Q 1/268* (2013.01); *B60Q 1/2696* (2013.01); *B60Q 3/208* (2017.02); *B60Q 3/76* (2017.02); *B60Q 3/80* (2017.02); *B60Q 9/00* (2013.01); *B62D 25/06* (2013.01); *H01L 33/54* (2013.01); *H01L 33/62* (2013.01); *B32B 2255/10* (2013.01); *B32B 2305/34* (2013.01); *B32B 2307/102* (2013.01); *B32B 2307/4026* (2013.01); *B32B 2307/412* (2013.01); *B32B 2315/08* (2013.01); *B32B 2329/06* (2013.01); *B32B 2457/00* (2013.01); *B32B 2605/006* (2013.01); *H01L 25/13* (2013.01); *H01L 33/60* (2013.01); *H01L 2933/0033* (2013.01)

(56) References Cited

U.S. PATENT DOCUMENTS

| | | | |
|---|---|---|---|
| 2007/0148472 A1* | 6/2007 | Masaki | B32B 17/10036 428/426 |
| 2009/0114928 A1* | 5/2009 | Messere | B32B 17/10 257/88 |
| 2010/0179725 A1 | 7/2010 | Boote et al. | |
| 2015/0146286 A1 | 5/2015 | Hagen et al. | |
| 2018/0207909 A1* | 7/2018 | Vivier | G06F 3/044 |
| 2019/0134952 A1* | 5/2019 | Varanasi | B32B 17/10036 |
| 2019/0160789 A1* | 5/2019 | Mattos, Jr. | B32B 15/20 |

FOREIGN PATENT DOCUMENTS

| | | |
|---|---|---|
| WO | WO 2012/025685 A1 | 3/2012 |
| WO | WO 2013/175101 A1 | 11/2013 |
| WO | WO 2013/189794 A1 | 12/2013 |
| WO | WO 2015/031594 A2 | 3/2015 |
| WO | WO 2015/066201 A1 | 5/2015 |
| WO | WO 2015/079159 A1 | 6/2015 |
| WO | WO 2016/001508 A1 | 1/2016 |

* cited by examiner

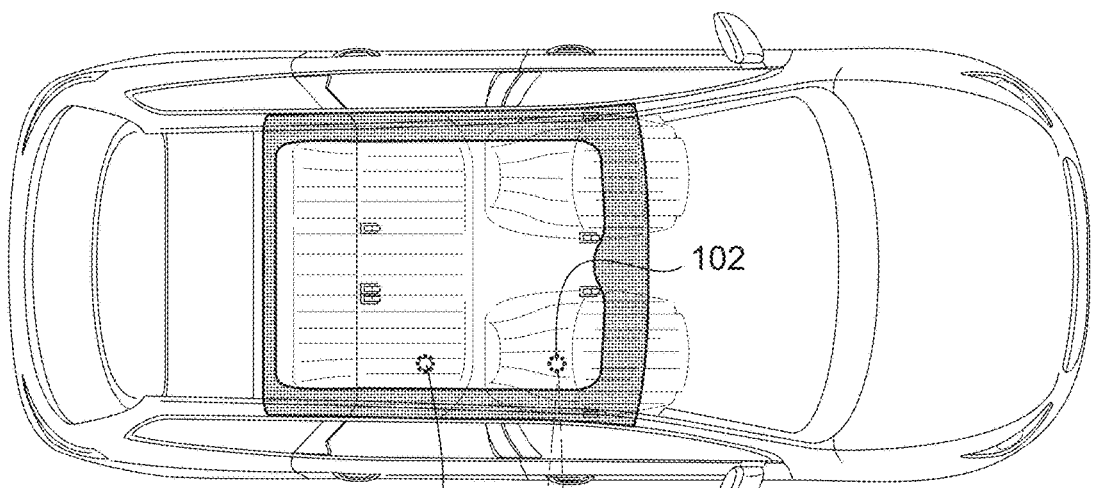
Fig.1
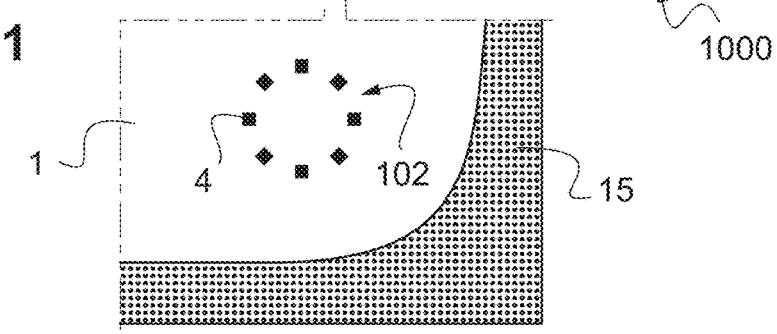
Fig.1'
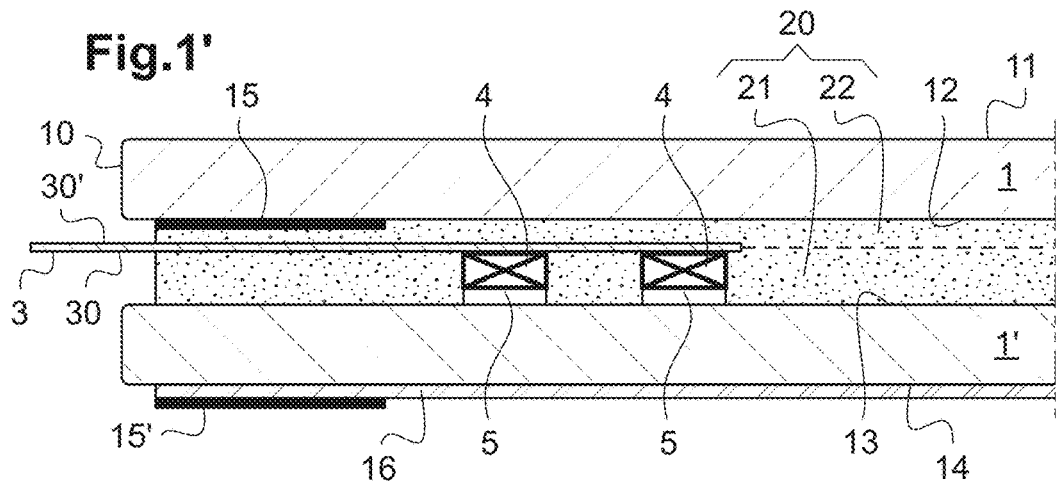
Fig.1"
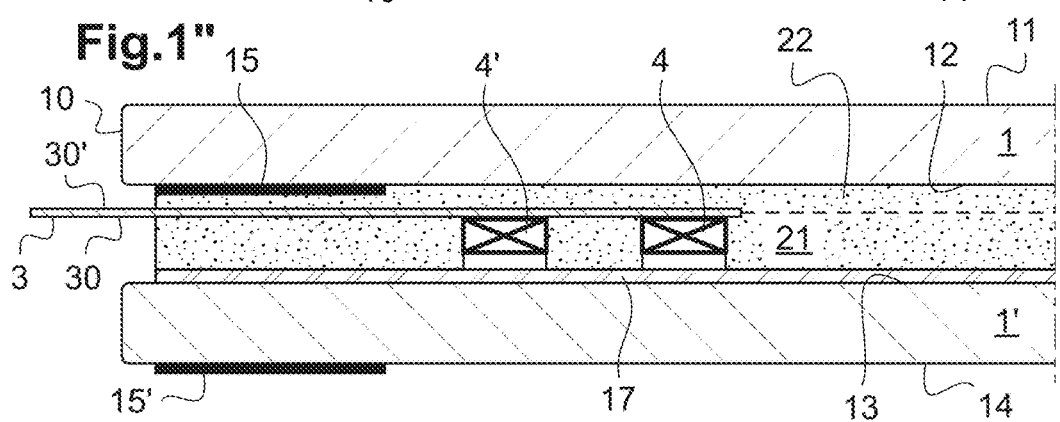

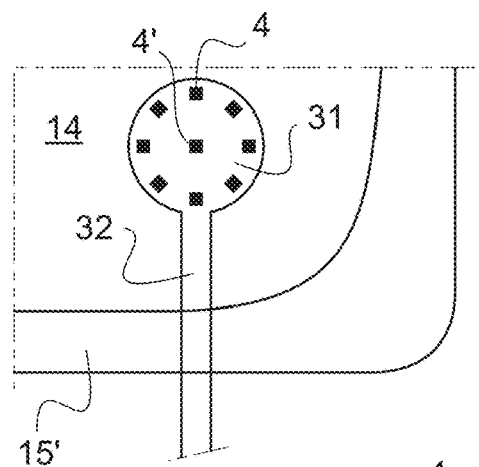
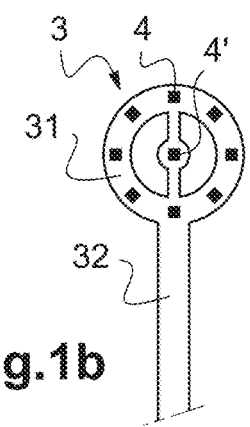
Fig.1a
Fig.1b
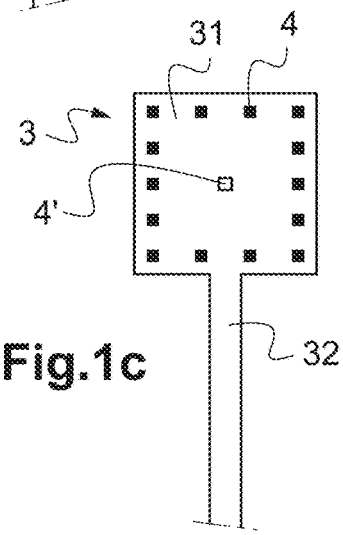
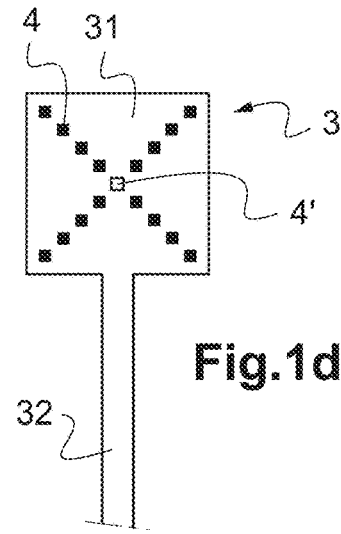
Fig.1c
Fig.1d
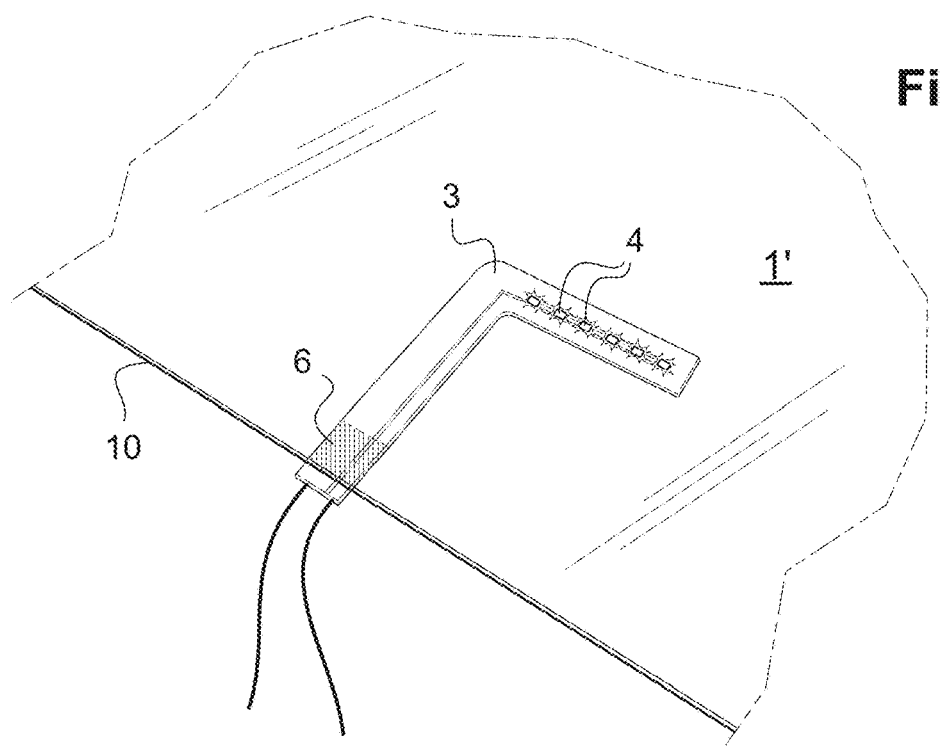
Fig.1e

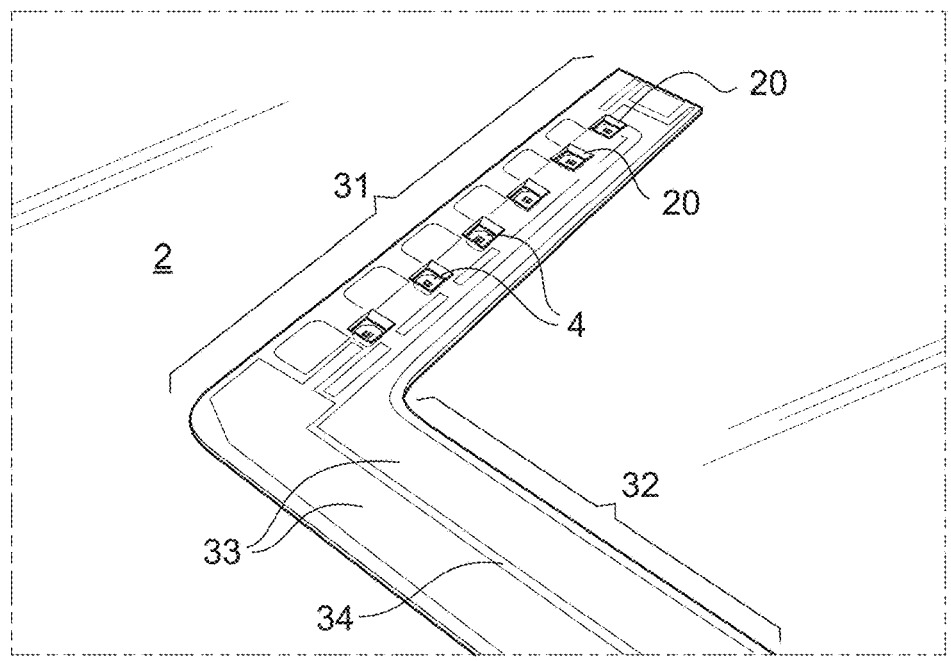
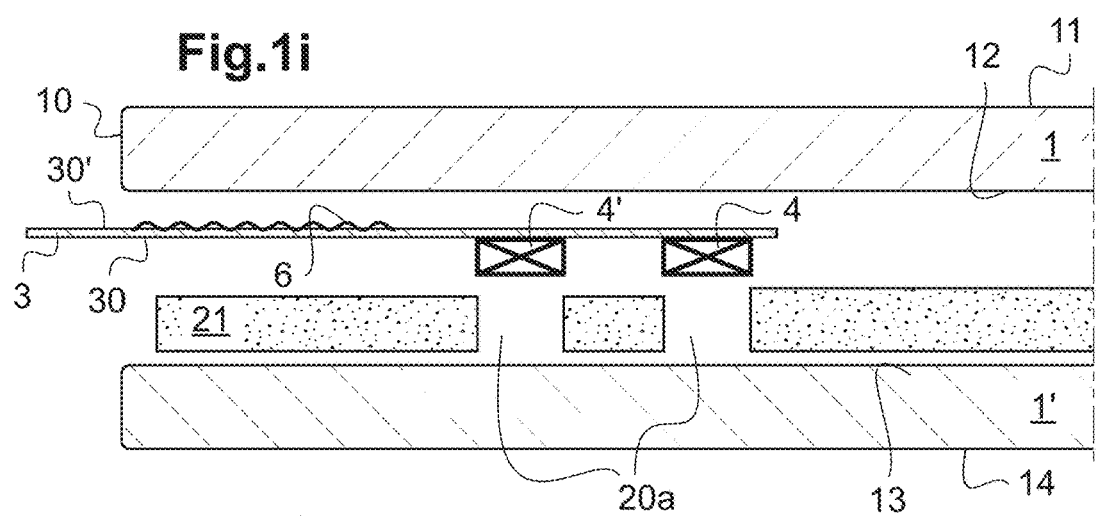
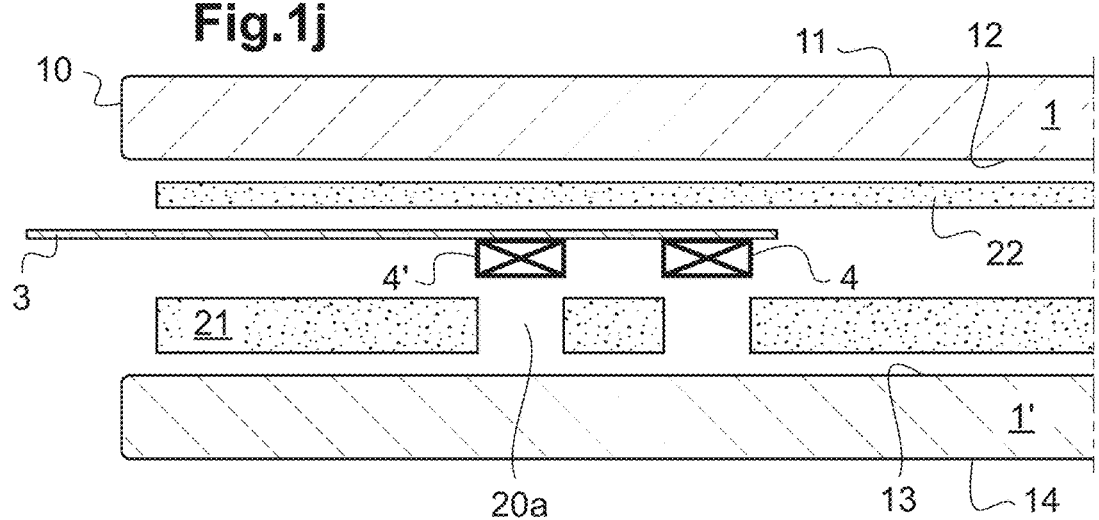

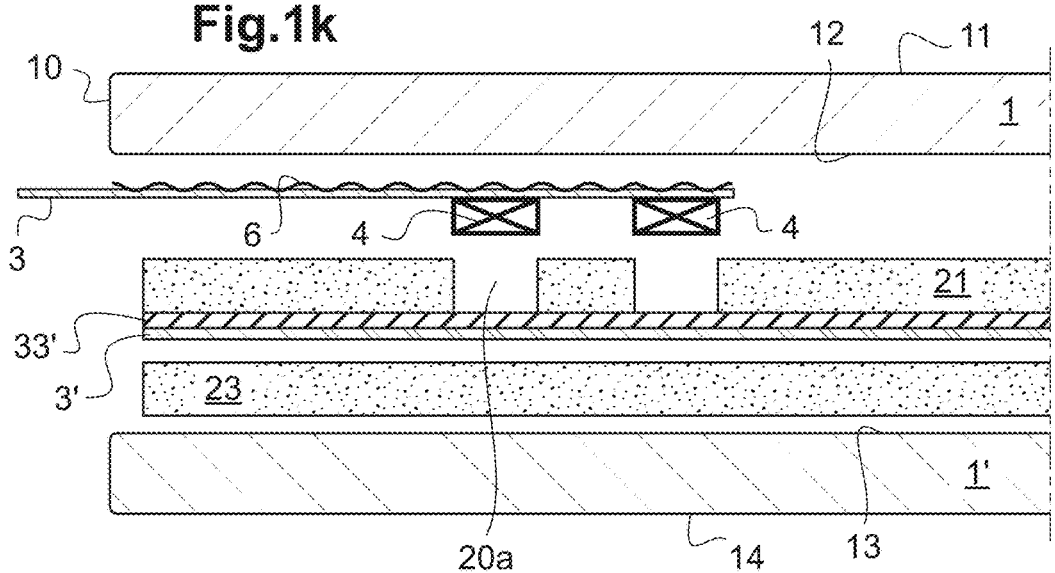
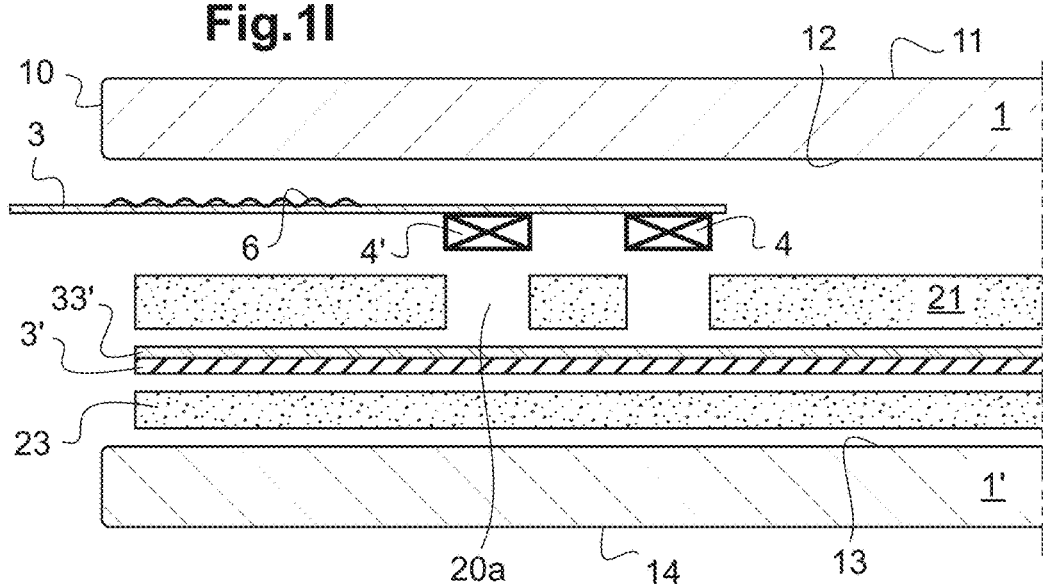
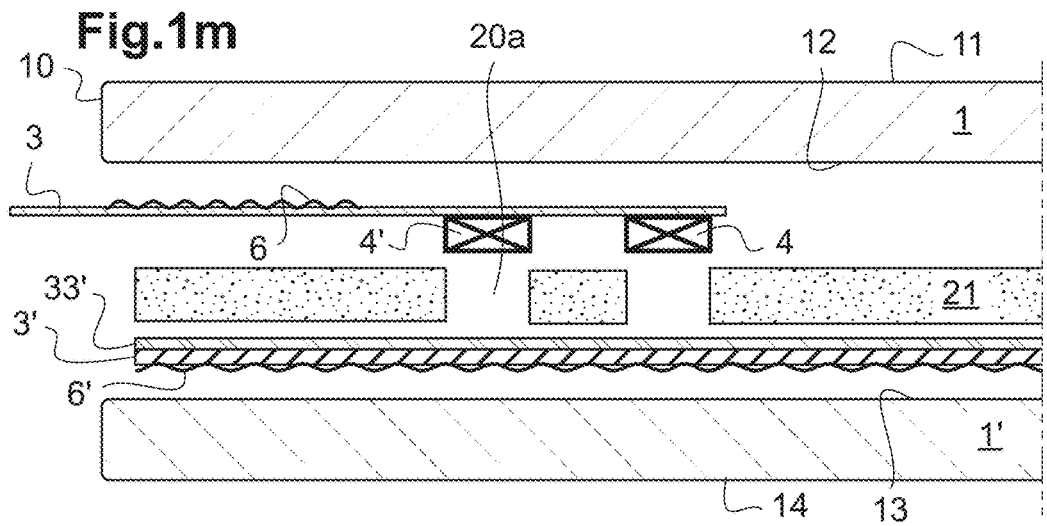

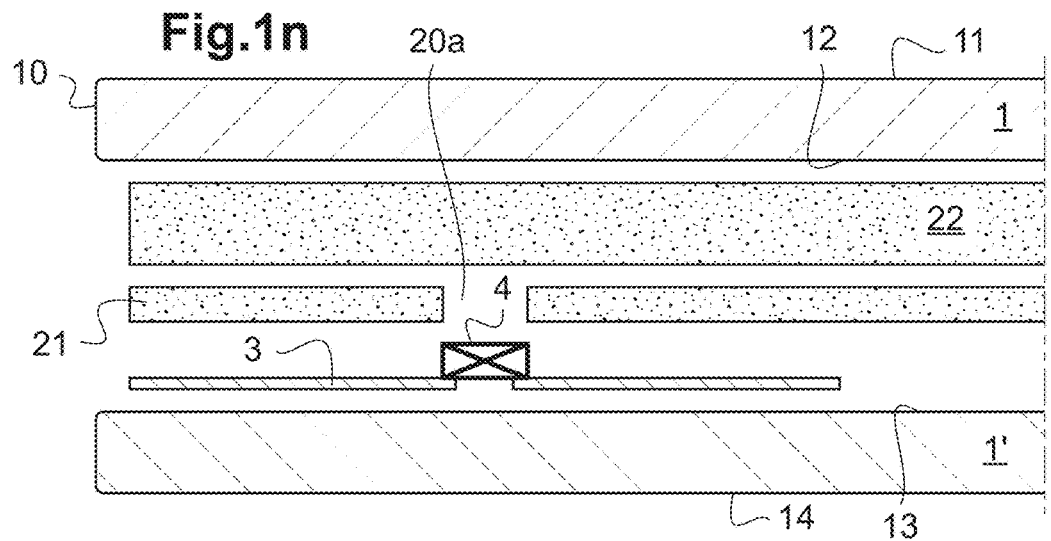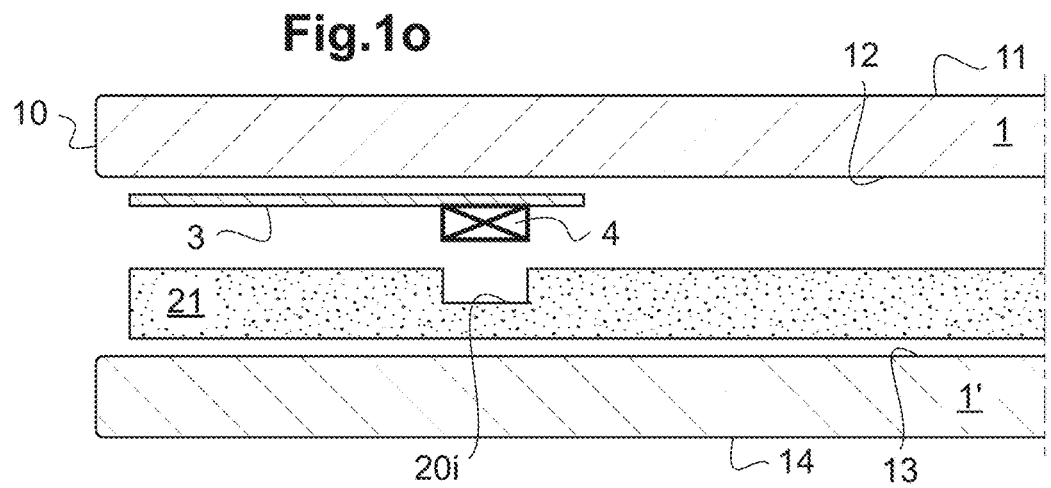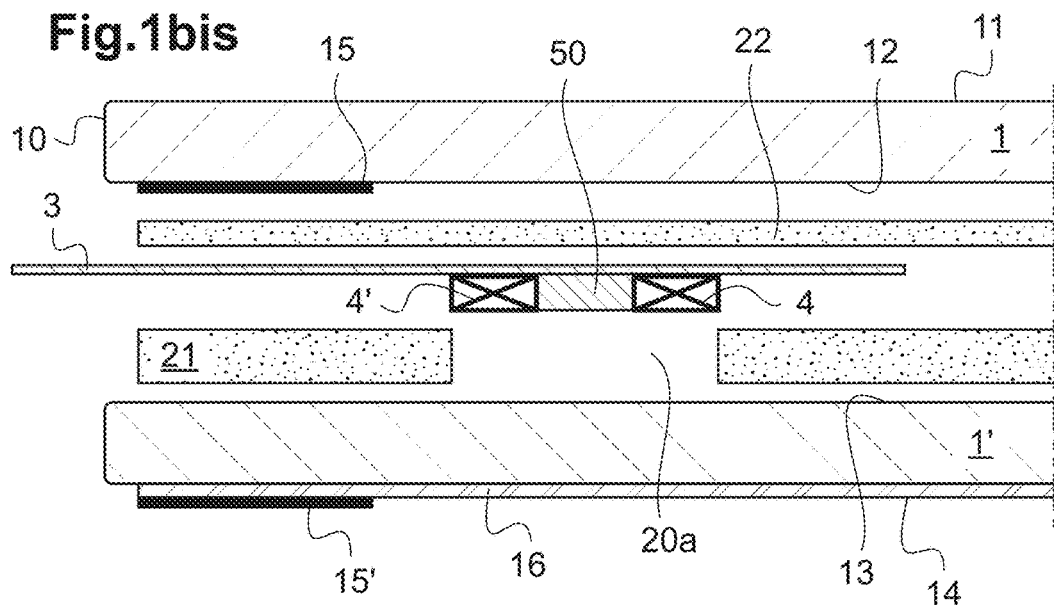

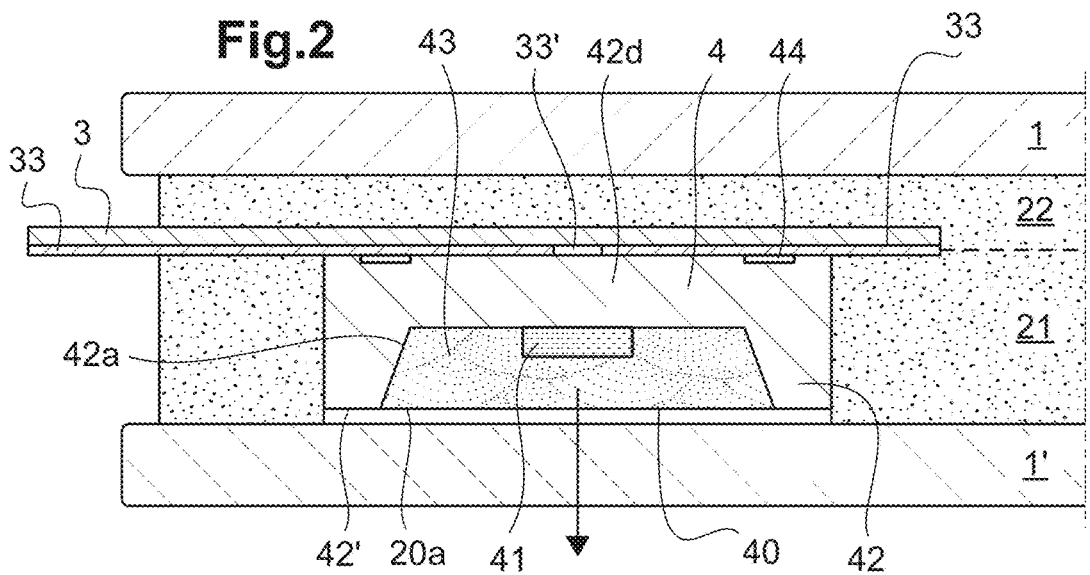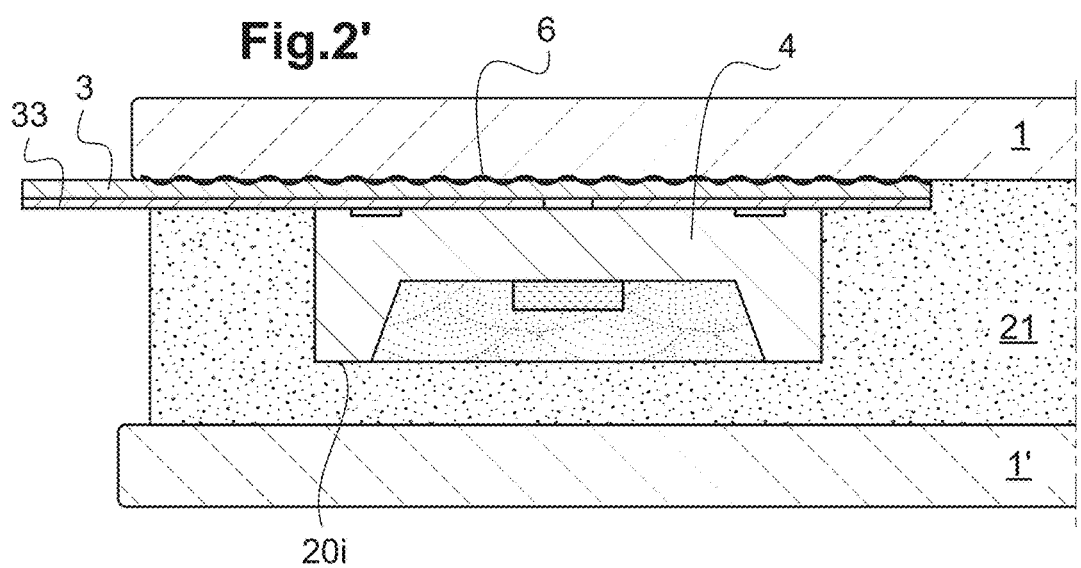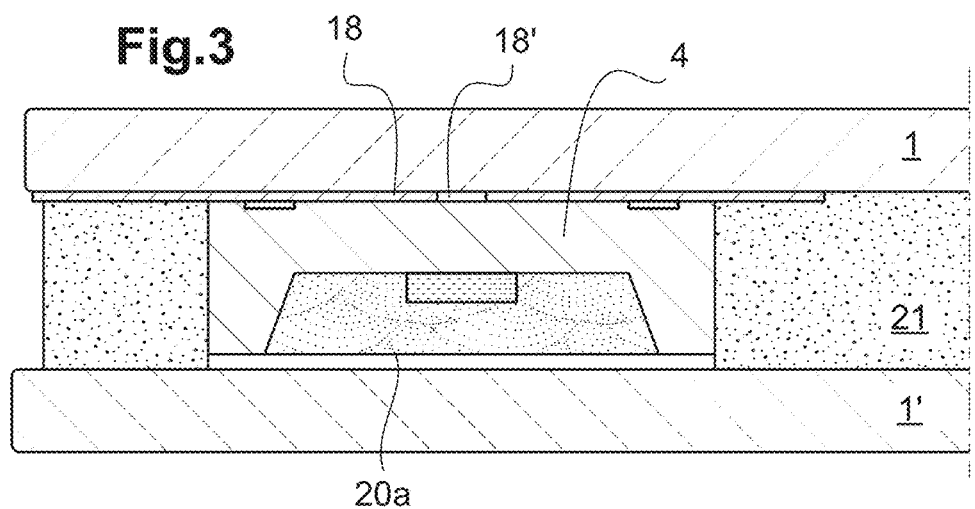

VEHICULAR LUMINOUS LAMINATED GLAZED ROOF, VEHICLE INCORPORATING SAME AND MANUFACTURE

CROSS-REFERENCE TO RELATED APPLICATIONS

This application is the U.S. National Stage of PCT/FR2017/051286, filed May 24, 2017, which in turn claims priority to French patent application number 1600850 filed May 26, 2016. The content of these applications are incorporated herein by reference in their entireties.

The invention relates to a vehicular luminous laminated glazed roof and to a vehicle including such a roof and to the manufacture of such a roof.

Glazed automobile roofs are becoming increasingly common and certain thereof are capable of providing light for ambient lighting. The light originates directly from light-emitting diodes integrated into the laminated glazing.

More precisely, document WO2013189794, in the embodiment described with reference to FIG. 1, includes a luminous glazed automobile roof comprising:
a laminated glazing including:
  a first glazing, forming an exterior glazing, with first and second main faces, often called F1 and F2;
  a lamination interlayer taking the form of three PVB sheets;
  a second glazing, forming an interior glazing, with third and fourth main faces, often called F3 and F4,
the second and third faces being the internal faces of the glazing; and
  a set of diodes on a thin carrier that is a strip of glass including an electrical-supply circuit formed from a conductive oxide layer,
each diode having an emitting face emitting in the direction of the interior glass, the central sheet of the lamination interlayer having a through aperture all away the around the strip of glass for its integration.
  The rejection rate of this glazing could be improved and thereby its manufacturing cost decreased. Thus the invention relates to a glazed roof that is more robust and even more compact and/or simple to manufacture.

For this purpose, the first subject of the present application is a luminous laminated glazed roof for a vehicle and in particular an automobile or even a mode of public transport, said roof comprising:
a laminated glazing including:
  a first (transparent) glazing, made of preferably curved, optionally clear, extra-clear or preferably tinted, in particular gray or green, mineral glass, intended to be the exterior glazing, with first and second main faces, called face F1 and face F2, respectively, and, for motor vehicles, preferably at most 2.5 mm, even of at most 2.2 mm—in particular 1.9 mm, 1.8 mm, 1.6 mm and 1.4 mm—or even of at most 1.3 mm or at most 1 mm in thickness;
  a second (transparent) glazing, intended to be the interior glazing, which is made of preferably curved and preferably clear or extra-clear or even tinted (less than the first glazing) mineral glass, with third and fourth main faces, face F3 and face F4, respectively, and, for motor vehicles, preferably of thickness smaller than that of the first glazing, even of at most 2 mm—in particular 1.9 mm, 1.8 mm, 1.6 mm and 1.4 mm—or even of at most 1.3 mm or of less than 1.1 mm or even of less than 0.7 mm and in particular of at least 0.2 mm, the total thickness of the first and second glazings preferably being strictly smaller than 4 mm, and even than 3.7 mm, the second glazing possibly being chemically toughened;
  between faces F2 and F3, which are the internal faces of the laminated glazing, an optionally clear, extra-clear or even tinted, in particular gray or green, lamination interlayer (tinted above all if the apertures are through apertures) made of preferably thermoplastic polymeric material and better still made of polyvinyl butyral (PVB), said lamination interlayer film (single sheet or composite sheet) having a main face FA face F2 side and a main face FB face F3 side, the face FA possibly making adhesive contact with the face F2 (which is uncoated or coated with a coating) and the face FB possibly making adhesive contact with the face F3 (which is uncoated or coated with a coating), lamination interlayer of a thickness $E_A$ between the face FA and FB—which for a motor vehicle—is preferably at most 1.8 mm, better still at most 1.2 mm and even at most 0.9 mm (and better still at least 0.3 mm and even at least 0.6 mm), said interlayer, in particular a first acoustic and/or tinted sheet, in particular being set back from the edge face of the first glazing by at most 2 mm and set back from the edge face of the second glazing by at most 2 mm; and
  at least one inorganic light-emitting diode or preferably a set of N>1 inorganic light-emitting diodes, each diode including at least one semiconductor chip preferably in a package, each chip being (having at least one emitting face) able to emit in the direction of the face F3, and each diode in particular having an edge face and a front surface (in the plane of the front face of the package) and said diode even preferably having a width W4 (maximum dimension normal to the optical axis) of at most 10 mm and even of at most 8 mm and even of at most 6 mm, each diode being of sub-millimeter-sized thickness e2 that is in particular larger than 0.2 mm.
Said lamination interlayer is provided between face FA and face FB with a (through or blind) aperture or with a set of M>1 apertures that are preferably through apertures or that form blind holes, each aperture being of width $W_A$ (larger than or equal to that of the diode in the aperture) of at most 20 mm and even of at most 15 mm.

Each diode is associated with one through aperture or one blind hole (therefore one blind or through aperture per diode, each aperture therefore being individual) housing (encircling the edge face of) the diode or at least one group of said diodes is associated with a given what is called common through aperture or a what is called common blind hole, housing the group of diodes.

Furthermore:
the diode or diodes of said set of diodes, or even all the diodes, may be on the face F2, which is in particular provided with an electrically conductive (preferably transparent) layer made up of two or more zones for electrically connecting the diodes, which zones are isolated via one or more insulating strips that are in particular sub-millimeter-sized in width; it may be an electrically conductive layer covering face F2 and furthermore having a function as a solar control and/or heating layer, or even of electrically conductive (local) tracks on the front face of a flexible carrier that is what is called the diode carrier, of thickness e'2 that is sub-millimeter-sized and preferably at most or less than 0.2 mm, between the face FA and the face F2;
and/or diodes of said set of diodes are reverse mounted on the face F3, which is in particular provided with an electrically conductive (preferably transparent) layer made up of two or more zones for electrically connecting the diodes, which zones are isolated via one or more insulating strips that are in particular sub-millimeter-sized in width; it may be an electrically conductive layer covering face F3 and furthermore having a function as a solar control and/or heating layer, or even of electrically conductive (local) tracks on the face of a flexible carrier that is what is called the diode carrier, of sub-millimeter-sized thickness e'2 and preferably smaller than 0.2 mm between the face FB and the face F3. In particular:

when the aperture is a through aperture and the face FB makes contact with the face F3, (the front surface of) the diode is preferably set back from face F3;

when the aperture is a through aperture and when the diode is reverse mounted and the face FA makes contact with the face F3, the diode is preferably set back from face F2 (from face FA); and when the hole is blind, the remaining thickness, called the bottom thickness Hf, is preferably at most 0.3 mm and/or at least 0.1 mm or 0.2 mm.

Thus, the present invention proposes local cut-outs in the lamination interlayer, which cut-outs are dedicated to the diodes. In particular, the need to cut all the way around the diode carrier (PCB board) as was the practice in the prior art, which increased the risk of a poor-quality assembly (bubbles, delaminations, esthetic defects) is avoided.

In particular, the optional diode carrier is flexible and quite thin in order to avoid the need to have to add a PVB sheet on the back face of the carrier. The group of diodes in a common (blind or through) hole may be inscribed in an area S of width or length of at most 20 mm.

The lamination interlayer is preferably closest the diodes and preferably, taking into account the tolerance in the position of the diodes during the cutting, the cut-out is preferably chosen to be wider than the width of the diodes (even if the interlayer is malleable).

The in particular PVB lamination interlayer with the through (or blind) aperture between the face FA and face FB may be thicker than the diodes, but if it is the thickness difference will be as small as possible in order not to risk generating too many air bubbles.

It may be preferred to use a single sheet (of PVB) for the interlayer for economic reasons (cost of material and simply one series of local cut-outs to make).

The use of a single sheet (of PVB) of preferably standard thickness i.e. 0.78 mm or 0.81 mm (for greater safety rather than 0.38 mm) is made possible by the choice of new ultra-thin power diodes that have only very recently become available on the market.

The lamination interlayer may have, between face F2 and F3, a total thickness $E_T$ of at most 1.8 mm, better still at most 1.2 mm and even of at most 0.9 mm (and better still of at least 0.3 mm and even of at least 0.6 mm), taking the form of a single sheet (with the one or more apertures, for example made of PVB, or in particular a composite sheet) or a plurality of sheets (preferably two sheets or even at most three sheets), in particular a clear or tinted acoustic sheet (preferably made up of three layers or even four or more layers). These sheets (first sheet with the one or more apertures, and second sheet) may make contact in a zone (outside the zone of the optional diode carrier) and/or be distant or spaced apart (separated by a covering, in particular PET, plastic film, etc.). $E_T$ may be the sum of the thicknesses of sheets that make contact or that are not contiguous.

In one preferred embodiment:

the thickness of the lamination interlayer between the face FA and the face FB is sub-centimeter-sized and preferably between 0.7 and 0.9 mm; and the total thickness $E_{tot}$ of PVB between F2 and F3 is sub-centimeter-sized.

The lamination interlayer (in particular the sheet or portion with the one or more apertures) may be an in particular trilayer acoustic PVB sheet.

In particular, in one embodiment, the lamination interlayer is formed from a single (clear, extra-clear or tinted), preferably PVB, sheet with the preferably through apertures, and the back face of the diode carrier is against or adhesively bonded to face F2. The single sheet may be an acoustic PVB sheet.

In another embodiment, a thermoplastic sheet, preferably of PVB, is present between the back face of the diode carrier and face F2 or face F3, in reverse-mount configuration, said sheet preferably having a thickness of at most 0.4 mm, or acoustic and in particular tinted if face F2 side.

A first preferably PVB sheet with the through apertures or even the blind holes may be used and a second preferably PVB sheet (which may be thinner than the first sheet) added on the side of the back face of the diode carrier. This second sheet is preferably of the same extent as the sheet with the through apertures. This second sheet may have a thickness of at most 0.38 mm and even of at most 0.2 mm and in particular is clear, extra-clear or tinted. The first sheet may be a sheet of, preferably clear (extra clear), acoustic PVB that is preferably between 0.6 and 0.9 mm in thickness.

In contrast, the second, preferably PVB, sheet may be between 0.7 and 0.9 mm in thickness and even of thickness larger than or equal to the first, preferably PVB, sheet. In particular, the first, preferably PVB, sheet is clear and the second sheet is a sheet of in particular tinted acoustic PVB.

As mentioned above, it is possible to use two (or more) sheets (preferably of PVB) as indicated for greater mechanical strength. For example:

a first, for example tinted sheet (preferably of acoustic PVB for example) with the blind or through apertures of thickness of at most 0.4 mm; and a second, preferably PVB, sheet of thickness of at most 0.4 mm and even of at most 0.2 mm and in particular of 0.19 mm.

If the diodes (and the diode carrier) are thin enough, these thicknesses may be reversed. For example:

a first sheet (preferably of PVB) with the blind or through apertures of thickness of at most 0.4 mm and even of at most 0.2 mm; and a second sheet (preferably of PVB) of thickness of at most 0.4 mm.

In one preferred embodiment, the walls of one or more through apertures or blind holes are spaced apart by at most 0.5 mm and better still at most 0.2 mm or even 0.1 mm from the edge face of the diode, or diodes of said group, housed therein and even make contact with the edge face of the diode, or diodes of said group, housed therein.

The aperture or hole may be filled by the diode (or the group of diodes).

A diode may be of the chip-on-board type or even most preferably a surface mount device (SMD) then including a peripheral package.

In one preferred embodiment, each, preferably power, diode is an electronic component including at least one semi-conductor chip and is equipped with a polymeric or ceramic peripheral package encapsulating the edge face of the electronic component (and defining the edge face of the diode), said package surrounding the semiconductor chip.

The package may correspond to the maximum thickness (height) e2 of the diode. The package is for example made of epoxy. A polymeric package may optionally be compressed (the final thickness after lamination may be smaller than the initial thickness) during the lamination. The (polymeric) package may be opaque.

The package (which is monolithic or made of two parts) may comprise a portion forming a support bearing the chip and a portion forming a reflector that flares with distance from the support above the chip, and containing a protective resin and/or a material having a color conversion function. The front surface may be defined as the surface of this material covering the chip, this surface being set back from or level with the "front" surface of the reflector.

In one preferred embodiment, each preferably power diode is a semiconductor electronic component including the semiconductor chip, and is equipped with a polymeric or ceramic peripheral package encapsulating the edge face of the electronic component and protruding with respect to and encircling the semiconductor chip—said package defining the edge face of the diode and the front surface of the diode—and the lamination interlayer (by reflow during the lamination) spreads as far as to between the what is called front surface of the package and the face F3 without spreading as far as to the front face of the diode (emitting face of the chip or face of the assembly consisting of the chip and the covering material that provides protection or a wavelength conversion function). Optionally, the electronic component includes what is called a lower portion bearing the one or more semiconductor chips and an upper portion that is flared toward face F3.

The lamination interlayer spreads as far as to between said front surface of the package and face F3 without making contact with the emitting face of the chip, the width of the aperture W' in the plane of the front surface being smaller than W and larger than the width W'2 of the emitting face of the chip.

The package may correspond to the maximum thickness (height) e2 of the diode. The package is for example made of epoxy. A polymeric package may optionally be compressed (the final thickness after lamination may be smaller than the initial thickness) during the lamination. The (polymeric) package may be opaque.

The diode may comprise a protective resin or a material having a color conversion function, conventionally on the semiconductor chip. The semiconductor chip may be embedded in a material (resin, etc.). The package may have a profile that flares with distance from the chip and the space between the chip and the package may contain a protective resin or a material having a conversion function.

The (chips on-board or SMD) diode may be devoid of optical element (lens etc.) above the semiconductor chip (which is optionally embedded in the material) to facilitate compactness.

Before lamination, the lamination interlayer (with the one or more blind or through apertures) may be spaced apart by at most 0.5 mm and better still at most 0.1 mm from the edge face of the diode and after lamination, because of reflow, the lamination interlayer with the one or more blind or through apertures may be less spaced apart from and even make contact with the edge face. Furthermore—in the case of one or more through apertures—the lamination interlayer may overflow onto the front face of the component in particular while encircling the semiconductor chip, without however spreading so far as to face and/or make contact with the emitting face of the chip. The blind hole or holes may be filled with the diode or diodes.

Preferably, the one or more diodes are components that are surface mounted on the front face of a diode carrier and the one or more diodes may even have a Lambertian or quasi-Lambertian emission pattern.

In one preferred embodiment, the thickness of lamination interlayer between face FA and face FB, which ranges from 0.7 to 0.9 mm (a single sheet or a first sheet and a second sheet), is made of PVB, the diodes are surface mount devices on the front face of the diode carrier, and e'2 is at most (or less than) 0.2 mm and better still at most 0.15 mm and even at most 0.05 mm.

The width of the diode carrier, which may be a PCB board, is preferably at most 5 cm, better still at most 2 cm, and even at most 1 cm. The width (or length) of a diode with a single semiconductor chip, such diodes generally being square in shape, is preferably at most 5 mm. The length of a diode with a plurality of semiconductor chips (typically surrounded by the package), such diodes generally being rectangular in shape, is preferably at most 20 mm and better still at most 10 mm.

In particular in the case of a single sheet—with the through apertures or blind holes—in particular an optionally acoustic tinted or clear PVB sheet—the diode carrier (which is sufficiently malleable to adapt to the shape of the curved laminated glazing) may be adhesively bonded to or pressed against face F2 or face F3 in a reverse-mount configuration, e'2 is at most 0.15 mm and even at most 0.1 mm and the adhesive bonding in particular may be achieved with an adhesive (glue or preferably a double-sided adhesive) of thickness e3, where e30.1 mm, better still e30.05 mm and is even such that e3+e'2 is at most 0.15 mm and better still at most 0.1 mm.

With this adhesive, preferably e3+et2≤e1 (above all if present on the back face of the PCB in the zone of the diodes).

The entire length of the carrier or discrete points (on or more blobs), in the diode zone and/or outside the diode zone, is/are adhesively bonded. The peripheral adhesive may form a seal to liquid water.

The diode carrier may be local and optionally with through apertures (in order to make it more inconspicuous). In particular, the diode carrier includes a diode-bearing first portion that is apertured.

The roof may comprise a sheet, in particular the lamination interlayer, made of thermoplastic material, between the back face of the diode carrier and face F2 or face F3 in reverse-mount configuration.

The lamination interlayer, formed from one or more films—between the face FA and FB and/or a sheet on the back face and/or even a sheet between the face FB and the face F3—may be made of made of polyvinyl butyral (PVB), of polyurethane (PU), of ethylene vinyl acetate copolymer (EVA), and for example have a thickness of between 0.2 and 1.1 mm.

It is possible to choose a conventional PVB such as RC41 from Solution or Eastman.

Thus, the lamination interlayer, between face FA and FB and/or a sheet on the back face and/or even a sheet between face FB and face F3—may comprise at least one what is called central layer made of a viscoelastic plastic having vibro-acoustic damping properties and in particular based on polyvinyl butyral (PVB) and plasticizer, the interlayer furthermore comprising two external layers made of standard PVB, the central layer being between the two external layers. By way of an example of an acoustic sheet, mention may be made of patent EP0844075. Mention may be made of the acoustic PVBs described in the patent applications WO2012/025685, WO2013/175101, in particular tinted as in WO2015079159.

Preferably, the roof has at least one of the following features:
- the (individual or common) preferably through aperture is in a thickness of PVB (or in one or more PVB sheets, the interface(s) of which are in particular discernible);
- the (individual or common) preferably through aperture is in an in particular three-layer or four-layer acoustic lamination interlayer, in particular of PVB;
- the (individual or common) preferably through aperture is in a tinted, in particular PVB lamination interlayer (in particular masking a little the diode carrier);
- the (individual or common) aperture is in a composite (multisheet) material: a PVB sheet/transparent plastic film or even of a PVB sheet/transparent plastic film/PVB sheet, said plastic film, in particular a PET film, of sub-millimeter-sized thickness that is in particular at most 0.1 mm or even at most 0.15 mm or at most 0.05 mm, preferably (being transparent and) bearing a functional coating (electrically conductive layer that in particular is transparent): low-emissivity or solar control and/or even heating functional coating, the/each (individual or common) aperture in particular being blind and in one of the PVB sheets and away from the functional coating;
- the spacing between blind or through apertures is at least 0.1 mm or better still at least 0.2 mm and preferably at most 50 cm for a reading light function;
- the spacing between diodes of distinct blind or through apertures is at least 0.1 mm or better still at least 0.2 mm; and
- the spacing between diodes in a blind or through, common aperture is at least 0.1 mm or better still at least 0.2 mm and even at most 1 mm.

Naturally, the face FB of the interlayer with the one or more apertures or another PVB sheet may make direct contact with the face F3 (face F2, respectively if the one or more diodes are reverse-mount diodes) or with a conventional functional coating on this face F3 (face F2, respectively if a reverse-mount configuration is used), in particular a stack of thin layers (including one or more silver layers) such as: a heating layer, antennae, a solar-control layer or low-emissivity layer, or an (opaque) decorative or masking layer such as a layer of, generally black, enamel.

The glass, preferably the internal glass, which in particular is thin and of thickness smaller than 1.1 mm, may preferably be chemically tempered. It is preferably clear. Mention may be made of the examples of patent applications WO2015/031594 and WO2015066201.

In the present invention, the expressions "blind hole" and "blind aperture" designate the same thing.

The diodes are preferably power diodes that in operation are under supplied electrically with current, preferably by a factor of at least 10 and even of at least 20 (therefore intensity/10 or even intensity/20) in particular so as to maintain a temperature below the reflow temperature of the polymeric material of the lamination interlayer, and in particular a temperature of at most 130°, better still of at most 120° C. and even of at most 100° C.

These diodes guarantee an excellent efficiency and do not generate too much heat.

For example for diodes with a current rating of 1 A a current of between 50 and 100 mA is chosen.

The inorganic diodes are for example based on gallium phosphide, gallium nitride and/or aluminum gallium nitride.

The diode carrier (PCB board) may be sufficiently malleable (flexible) to adapt to the curvature of the curved laminated glazing.

In one embodiment, the diode carrier includes a film made of a preferably transparent plastic material, preferably of polyethylene terephthalate or PET or of polyimide, provided with preferably transparent conductive tracks that are in particular metal (copper etc.) or made of transparent conductive oxide, and equipped with surface mount diodes. The conductive tracks are printed or deposited by any other deposition method, physical vapor deposition for example. The conductive tracks may also be wires. Preferably, the conductive tracks and the film are transparent when they are visible i.e. when they are not masked by a masking element (layer) (such as an enamel or even a paint etc.) in particular on face F4 or F3. The conductive tracks may be transparent either because they are made of a transparent material or because they are thin enough to be (almost) invisible.

Polyimide films have a higher temperature withstand than alternative PET or even PEN (polyethylene naphthalate) films.

The diode carrier may be local (for example occupying at most 20% or at most 10% of the area of the laminated glazing) or essentially cover faces F2 and F3 and preferably bears a low-emissivity or solar-control and/or even heating functional coating.

Preferably, the diode carrier, alone or associated with a flat connector, extends at least as far as to the edge face of the laminated glazing and preferably extends beyond the edge face, the diode carrier for example comprising a first portion with the one or more diodes and a narrower portion that extends beyond the glazing; and, between the back face of the diode carrier and face F2, is housed an adhesive that is impermeable to liquid water, of thickness of at most 0.1 mm and better still at most 0.05 mm, in particular a double-sided adhesive. Such an adhesive is preferred to an over-molding solution. It may be the preferably transparent adhesive used to attach (all) the diode carrier.

The diode carrier may include:
- a (rectangular) first portion bearing the one or more diodes;
- and a (rectangular) electrical-connection second portion, said portion leading to and even extending beyond the edge face of the laminated glazing.

This second portion may be (much) longer than the first portion and/or narrower than the first portion.

Preferably, the first portion is narrower than 2 mm. The diode carrier may have a doglegged shape and in particular be L-shaped.

The diode carrier may be associated with a flat connector that extends as far as to the edge face of the laminated glazing and that even extends beyond said face. A flexible connector that is able to adapt to the curvature of the laminated glazing, including a plastic, PEN or polyimide for example, is preferred. The flat connector may be of width (dimension along the—exit—edge face) smaller than or equal to the dimension of the diode carrier along the—exit—edge face.

The glazing may include a plurality of groups of diodes (and therefore, preferably through, apertures) with the same function or distinct functions.

The diodes (on a diode carrier) may emit the same light or light of different colors, preferably not at the same time.

To obtain a larger luminous area and/or different colors there may be—on a given diode carrier—a plurality of rows of diodes or indeed two diode carriers may be placed side-by-side (at least the first portions of the diode carriers, i.e. with the diodes, are placed side-by-side).

Preferably, said set of diodes of the glazed roof (preferably of a road vehicle) forms at least one of the following luminous zones:
- a luminous zone forming a reading light or providing ambient lighting, driver-side and/or co-driver side or for the rear passenger(s);
- a decorative luminous zone;
- a luminous zone including a sign, in particular one made up of one or more letters and/or one or more pictograms, in particular of network connectivity, co-driver side or for the rear passenger(s).

Preferably diodes of said set form a reading light and are preferably in a (common) through aperture or in through apertures and/or on the diode carrier between the face F2 and the face FA.

Preferably, one (of the diodes of said set, or the only) diode forms an indicator light of a remote, touch on/off switch face F3 side and facing the diode, the diode forming said indicator light preferably being on the diode carrier including diodes of said set—which preferably forms a reading light—between the face F2 and the face FA.

The diodes forming a reading light (light for reading) are along a lateral or longitudinal edge of the roof:
in (at least) one row forming a luminous strip;
in a circle, or in a square or even in a cross or any other shape.

The roof may comprise a scattering layer or a layer making it easier to locate the diode forming a status-indicator light of a (preferably capacitive) on/off switch of an electrically controllable device: diodes forming a reading light, (SPD) light valve, heating layer, etc.

The diode carrier may be entirely or partially in the vision area of the roof and optionally spaced apart from opaque peripheral strips (even forming an opaque frame), such as strips of a (black, dark, etc.) masking enamel. Most often, there is an opaque layer on face F2 and an opaque layer on face F4 or even F3. Their widths are identical or distinct.

The width Li of an opaque peripheral strip on face F2 and/or F3 and/or F4 is preferably at least 10 mm and even 15 mm. Thus, the length of the diode carrier may be larger than Li.

The diode carrier (at least the (first) portion with the one or more diodes and/or at least the (second) portion without the diodes, in particular for electrical connection and preferably extending beyond the edge face of the laminated glazing) may be arranged in or in the vicinity of the region of an opaque layer, in particular a (black) enamel, along a peripheral edge of the laminated glazing, generally on face F2 and/or face F4 or even on face F2 and/or face F3.

Thus, in a first embodiment, the diode carrier may even be located in a region of the roof, in which region the exterior glass is entirely (or partially) opaque because of the presence of an opaque layer (the most external opaque layer), such as a layer of (black) enamel, on F2. This opaque layer may, in this region of the roof, be an unapertured layer (continuous background) or a layer with one or more discontinuities (areas without opaque layer), said layer for example taking the form of a set of optionally geometric (circular, rectangular, square etc.) patterns that are of identical or distinct size (of size that decreases with distance from the edge face and/or the patterns getting further and further apart with distance from the edge face).

In this first embodiment, the one or more diodes or even the diode carrier may be visible only from the interior and therefore masked (from the exterior) by the opaque layer on face F2.

Alternatively or cumulatively to the first embodiment, (all or some of) the diode carrier may be placed in a region of the roof, in which region the interior glass is opaque because of the presence of an opaque layer (the most internal opaque layer), such as a layer of (black) enamel, preferably on F4 or even on F3. This opaque layer then includes at least one or more reserves (produced using a mask during deposition or by removing the opaque layer, in particular with a laser) in line with each diode. This opaque layer for example takes the form of a set of optionally geometric (circular, rectangular, square, etc.) opaque patterns that are of identical or distinct size (of size that decreases and/or the patterns getting further and further apart with distance from the edge face). Zones between the opaque patterns are in line with the diodes.

By way of diodes, mention may be made of the OSLON BLACK FLAT range sold by OSRAM. For red light, mention may be made of the following diode, which is sold by OSRAM: OSLON BLACK FLAT Lx H9PP. For orange (amber) light, mention may be made of the following diode, which is sold by OSRAM: LCY H9PP. For white light, mention may be made of the following diodes, which are sold by OSRAM: LUW H9QP and KW HxL531.TE where x=is the number of chips in the diode (4 or 5 for example).

By way of flexible PCB, mention may be made of the AKAFLEX® range of products (in particular the PCL FW) from KREMPEL.

In one embodiment of the vehicle, it includes at least one control unit for driving the diodes and even at least one sensor, in particular for detecting luminosity. A control unit for driving the diodes may be in the laminated glazing, on or off the diode carrier.

Preferably, the glazed roof according to the invention meets current motor-vehicle specifications in particular with respect to light transmittance $T_L$ and/or energy transmittance $T_E$ and/or energy reflectance $R_E$ and/or even with respect to total solar transmittance TST.

For an automobile roof, one of the or the following criteria are preferred:
$T_E$ of at most 10% and even from 4 to 6%;
$R_E$ (preferably face F1 side) of at most 10%, better still from 4 to 5%;
and TTS <30% and even <26%, even from 20 to 23%.

The TL may be low, for example at most 10% and even from 1 to 6%.

In order to limit heating of the passenger compartment or to limit the use of air conditioning, one of the glazings at least (preferably the exterior glass) is tinted, and the laminated glazing may also include a layer that reflects or absorbs solar radiation, preferably on face F4 or on face F2 or F3, in particular a transparent electrically conductive oxide layer, i.e. what is called a TCO layer, (on face F4) or even a stack of thin layers comprising at least one TCO layer, or stacks of thin layers comprising at least one silver layer (on F2 or F3), the or each silver layer being placed between dielectric layers.

It is possible to place both a (silver-containing) layer on face F2 and/or F3 and a TCO layer on face F4.

The TCO layer (of a transparent electrically conductive oxide) is preferably a layer of fluorine-doped tin oxide ($SnO_2$:F) or a layer of mixed indium tin oxide (ITO).

Other layers are possible, among which thin layers based on mixed indium zinc oxides (referred to as "IZOs"), based on gallium-doped or aluminum-doped zinc oxide, based on niobium-doped titanium oxide, based on cadmium or zinc stannate, or based on tin oxide doped with antimony. In the case of aluminum-doped zinc oxide, the doping level (i.e. the weight of aluminum oxide divided by the total weight) is preferably lower than 3%. In the case of gallium, the doping level may be higher, typically comprised in a range extending from 5 to 6%.

In the case of ITO, the atomic percentage of Sn is preferably comprised in a range extending from 5 to 70% and in particular from 10 to 60%. For layers based on fluorine-doped tin oxide, the atomic percentage of fluorine is preferably at most 5% and generally from 1 to 2%.

ITO is particularly preferred, in particular with respect to $SnO_2$:F. Being of higher electrical conductivity, to obtain a given emissivity level its thickness may be smaller. Easily deposited by a cathode sputtering process, in particular a magnetron cathode sputtering process, these layers are characterized by a lower roughness and therefore a lower tendency to foul.

One of the advantages of fluorine-doped tin oxide is, in contrast, that it is easy to deposit by chemical vapor deposition (CVD), which, contrary to the cathode sputtering process, does not require a subsequent heat treatment, and may be implemented on a float plate glass production line.

By "emissivity", what is meant is normal emissivity at 283 K as defined in standard EN12898. The thickness of the (TCO, etc.) low-emissivity layer is adjusted, depending on the nature of the layer, so as to obtain the desired emissivity, which depends on the sought-after thermal performance. The emissivity of the low-emissivity layer is for example lower than or equal to 0.3 and in particular to 0.25 or even to 0.2. For layers made of ITO, the thickness will generally be at least 40 nm, or even at least 50 nm and even at least 70 nm, and often at most 150 nm or at most 200 nm. For layers made of fluorine-doped tin oxide, the thickness will generally be at least 120 nm, or even at least 200 nm and often at most 500 nm.

For example, the low-emissivity layer comprises the following sequence: high-index underlayer/low-index sublayer/a TCO layer/optional dielectric overlayer.

By way of preferred example of a low-emissivity layer (protected during a temper) the following may be chosen: (<40 nm) high-index underlayer/(<30 nm) low-index underlayer/ITO layer/(5-15 nm) high-index overlayer/(<90 nm) low-index barrier overlayer/(<10 nm) last layer.

Mention may be made by way of low-emissivity layers of those described in patent US2015/0146286, on face F4, in particular in examples 1 to 3.

In one preferred embodiment:
the first and/or second glazing is tinted and/or the lamination interlayer is tinted in all or some of its thickness (in particular away from the side of the surface most exposed to light, often the surface where degradation occurs);
and/or face F2 or face F3 or face F4—preferably face F4—of the glazed roof is coated with a low-emissivity layer, in particular one comprising a transparent electrically conductive oxide layer (i.e. what is called a TCO layer) and in particular a stack of thin layers containing a TCO layer or a stack of thin layers containing one or more silver layers;
and/or face F2 or face F3 or face F4—preferably face F3—of the glazed roof is coated with a solar-control layer, in particular one comprising a transparent electrically conductive oxide layer (i.e. what is called a TCO layer) and in particular a stack of thin layers containing a TCO layer or a stack of thin layers containing one or more silver layers; and/or a tinted additional (polymeric) film (such as a film of polyethylene terephthalate PET, etc.) is between faces F2 and F3 or (adhesively bonded) to F4 or even to face F1. In particular, the face F4 of the glazing is coated with a transparent functional, in particular low-emissivity, layer that preferably contains a TCO layer comprising a zone (supplied with electricity and that therefore forms an electrode) forming a touch button (for controlling the first luminous area).

The invention of course relates to any vehicle and in particular to an automobile including at least one roof such as described above.

The invention lastly relates to a method for manufacturing the roof such as described above and that includes the following steps:
cutting, for example automatically (by robot) the lamination interlayer, which takes the form of a single leaf (preferably of optionally tinted and even acoustic PVB) or of a composite sheet consisting of a PVB sheet/plastic functional film bearing an optional functional coating or of a PVB sheet/plastic functional film bearing an optional functional coating/PVB sheet, said leaf or composite sheet preferably being of thickness of at most 0.9 mm and even (if a single PVB leaf) of thickness of at most 0.4 mm, to form one or more local and preferably through apertures (which are geometric: circular, square or rectangular and in particular the same shape as the diodes), the local apertures (or local blind holes) preferably being equal (and not greater) in number than the diodes, or one (local) aperture being common to the group of diodes;
or, more precisely, the (preferably PVB) lamination interlayer including a single (preferably PVB) first sheet or a composite first sheet consisting of a PVB sheet/plastic functional film bearing an optional functional coating or of a PVB sheet/plastic functional film bearing an optional functional coating/PVB sheet, said first sheet preferably having a thickness of at most 0.9 mm and even (if a single PVB sheet is used) a thickness of at most 0.4 mm, and a thermoplastic (preferably PVB) second sheet, which in particular is a thickness of at most 0.4 mm and even a thickness of at most 0.2 mm and between the back face of a diode carrier and the face F2 (or F3 if the one or more diodes are reverse-mount diodes), the first sheet, which is preferably at most 0.9 mm in thickness, is cut (automatically) to form one or more local and preferably through apertures (which are geometric: circular, square, rectangular and in particular the same shape as the diodes), the local apertures preferably being equal (and not greater) in number than the diodes, or one aperture that is common to the group of diodes; and
assembling the laminated glazing, with the one or more diodes housed in said blind or through aperture (which is in particular common to the group of diodes) or said blind or through (local) apertures (which are in particular individual, one aperture per diode), the one or more apertures, in particular before the lamination, being larger (wider) than the size (width) of the one or more diodes and preferably bigger (larger) by at most 1 mm and better still at most 0.5 mm or even at most 0.2 mm or at most 0.1 mm.

The lamination (application of pressure, heat) which may influence the width of the one or more apertures is achieved by reflow of the interlayer. By reflow, the lamination interlayer (first sheet, leaf or composite sheet) with the one or more apertures that are wider than the one or more diodes, spreads as fas as to make contact with the edge face of the diode (of its package). Furthermore, optionally, for each through aperture, the lamination interlayer (first sheet, leaf or composite sheet) may spread as far as to between said front surface of the package of the diode and the face F3 without however spreading so far as to make contact with the emitting face of the chip.

The diodes may be placed on the front face of the optional diode carrier manually or by robot (more precise).

The diode carrier with the diodes may be positioned with respect to the glazing (on the side of the back face of the carrier) and constrain the placement of the holed lamination interlayer, the lamination interlayer preferably being cut so that there is a surplus past the edge of the glazing (the excess being cut off after the glazing has been fitted front face side), or indeed the diode carrier with the diodes may even be positioned with respect to the holed lamination interlayer and be constrained by the placement of the latter, the lamination interlayer then preferably being cut to the exact shape of the laminated glazing. In particular, the one or more blind (and local) holes are produced in one of the PVB sheets of the composite sheet consisting of a PVB sheet/plastic functional film bearing the functional coating/PVB sheet without touching said functional coating.

Preferably, the one or more diodes are surface mount devices, preferably on a face that is what is called the front face, oriented face F3 (F2 in reverse-mount configuration) side, of a flexible diode carrier, in particular a preferably transparent (flexible) plastic film, with the front face placed against the leaf or the first PVB sheet with the one or more (blind or through) apertures, said diode carrier preferably extending beyond the edge face of the laminated glazing.

Furthermore, the back face may be adhesively bonded or against face F2 (F3 in reverse-mount configuration) side. In particular, a sheet preferably of (for example tinted and/or acoustic) PVB is between the back face and the face F2 (F3 in reverse-mount configuration), said sheet in particular being thinner than the leaf or the first (PVB or composite such as described above) sheet with the one or more blind or through apertures.

The present invention will now be described in greater detail with reference to the appended figures, in which:

FIG. 1 shows a top view of a luminous laminated glazed roof of a motor vehicle according to a first embodiment of the invention and a detail view of diodes forming a reading light.

FIG. 1' shows a schematic partial cross sectional view of the luminous laminated glazed roof in one variant of the first embodiment of the invention.

FIG. 1" shows a schematic partial cross sectional view of the luminous laminated glazed roof in one variant of the first embodiment of the invention.

FIGS. 1a, 1b, 1c, 1d and 1e show face-on views of diode carriers internal face side (oriented toward the passenger compartment).

FIG. 1'i shows a perspective view of a PVB sheet containing through apertures in the case of diodes in a row.

FIGS. 1i, 1j, 1k, 1l, 1m, 1n, 1o show schematic partial exploded cross sectional views of the luminous laminated glazed roof according to the invention, illustrating manufacturing processes.

FIG. 1bis shows a schematic partial exploded cross sectional view of the luminous laminated glazed roof, according to one embodiment of the invention.

FIG. 2 shows a schematic partial cross sectional detail view of the luminous laminated glazed roof according to one embodiment of the invention.

FIG. 2' shows a schematic partial cross sectional detail view of the luminous laminated glazed roof according to one embodiment of the invention.

FIG. 3 shows a schematic partial cross sectional detail view of the luminous laminated glazed roof according to one embodiment of the invention.

Figure 4A:
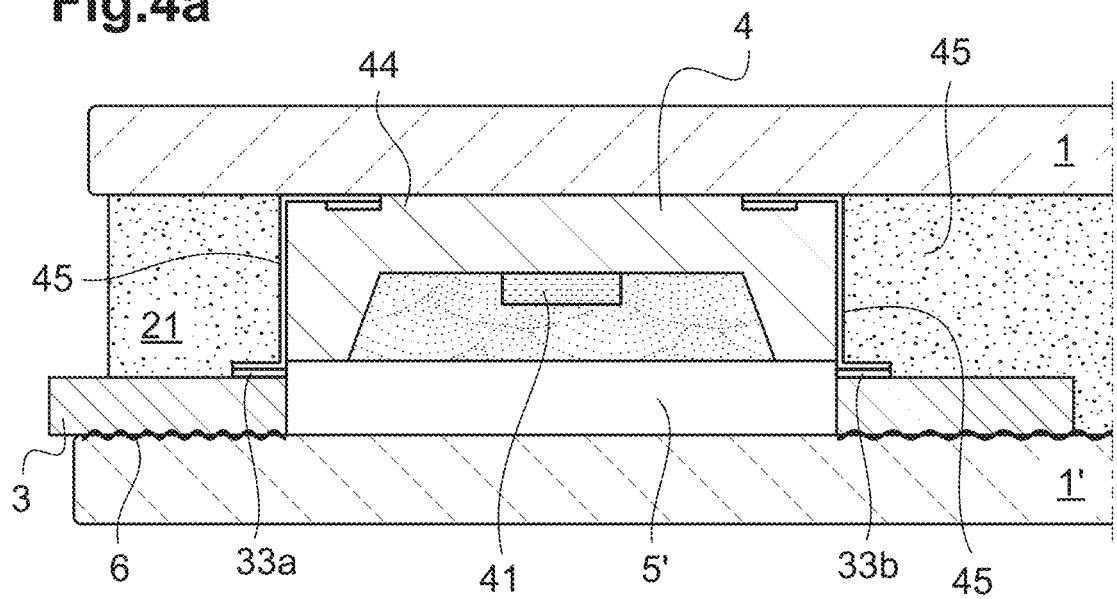
Figure 4B:
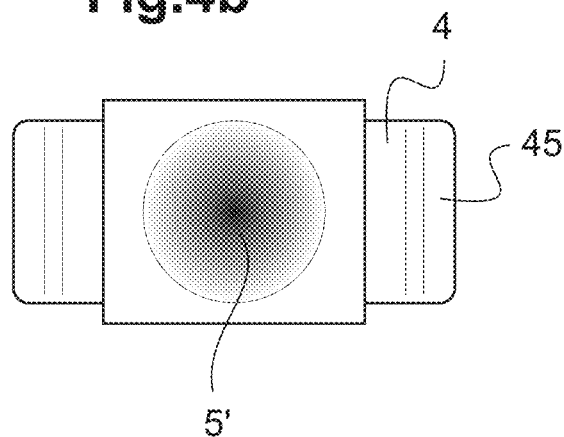
Figure 4C:
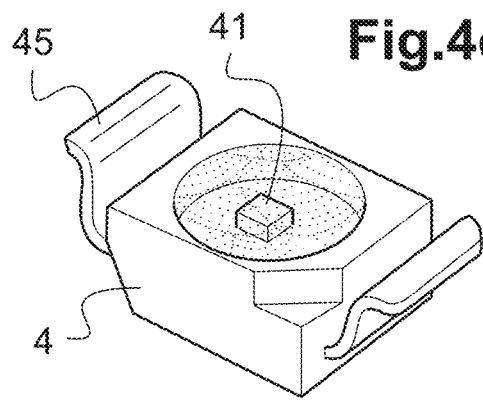

FIG. 4a shows a schematic partial cross sectional detail view of the luminous laminated glazed roof according to one embodiment of the invention and FIGS. 4b and 4c a bottom view and a perspective view, respectively, of examples of reverse-mount diodes.

Figure 5A:
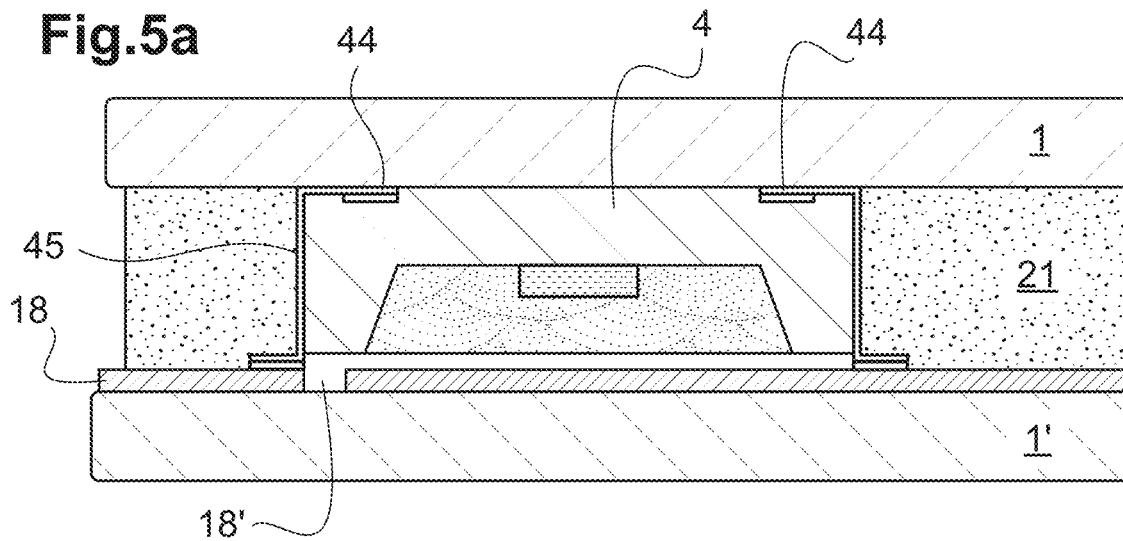

FIG. 5a shows a schematic partial cross sectional detail view of the luminous laminated glazed roof according to one variant of the embodiment of the invention of FIG. 4a.

Figure 6A:
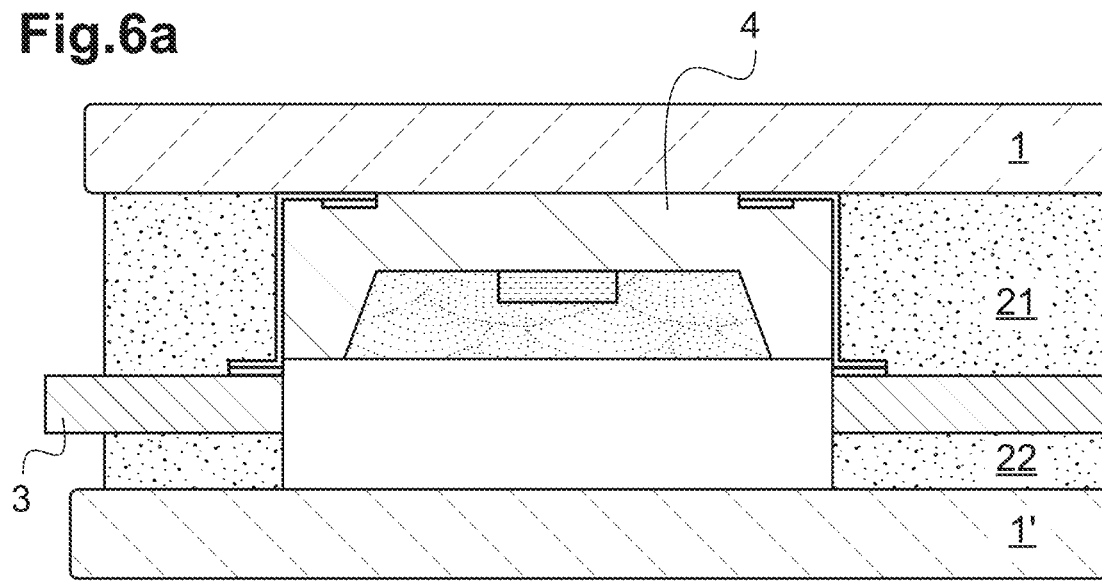

FIG. 6a shows a schematic partial cross sectional detail view of the luminous laminated glazed roof according to one embodiment of the invention, one variant of the embodiment of the invention of FIG. 4a.

FIG. 1 shows a top view of a luminous laminated glazed roof of a motor vehicle 1000 according to a first embodiment of the invention with two sets of diodes 4 one of which forms a rear reading light and the other a front reading light.

A first set of eight diodes 4 (cf. the detail view) is on a first printed circuit board, i.e. PCB board (not shown here), which is integrated between the two glazings of the laminated glazing, eight diodes forming a circle being placed in the vision area in a longitudinal edge zone in the vicinity of an external peripheral masking zone 15 (opaque enamel, etc.) on, or as a variant in front of, the exterior glazing, and an internal masking zone (layer, opaque enamel, etc.) of similar size on the interior glazing (not shown).

Alternatively, the reading light is masked by the internal masking zone and one or more reserves are produced in the internal masking zone or even in a (transition) zone containing an alternation of the masking zone (opaque layer, such as an opaque enamel) and transparent zone of the interior glazing.

FIG. 1' shows a schematic partial cross sectional view of the luminous laminated glazed roof in one variant of the first embodiment of the invention. The laminated glazed roof, which is curved, includes:

a first glazing 1, for example made of VG10 glass and of 2.1 mm thickness, forming the exterior glazing, with first and second main faces 11, 12 called face F1 and face F2, respectively;

a second glazing 1', forming the interior glazing, for example made of TSA (or clear or extra-clear) glass and of 2.1 mm thickness or even 1.6 mm thickness or even of less than 1.1 mm thickness (in particular chemically toughened glass), with third and fourth main faces 13, 14 called face F3 and face F4, respectively;

between face F2 and face F3, which form the internal faces 12,13 of the laminated glazing, a lamination interlayer 20, 21, 22 made of polymeric material, here made of PVB, of sub-millimeter-sized thickness $E_t$ of preferably about 1 mm or less, including a layer (a sheet) of PVB 21 with a face FB making adhesive contact with the (bare or coated) face F3 and containing a set of through apertures 5 (two may be seen here) between a face FA against a diode carrier 3 and the face FB, the thickness E between these faces FA and FB corresponds to the height H of the apertures, approximately 0.76 mm for example for a conventional PVB sheet (RC41 from Solutia or Eastman) or as a variant, if necessary, an acoustic (trilayer or quadlayer) PVB, for example of about 0.81 mm thickness; and a for example low-emissivity (ITO, etc.) functional layer 16 on face F4 and/or alternatively face F3, which is optionally coated with a (heating, low-emissivity, etc.) functional layer.

Inorganic surface mount device (SMD) light-emitting diodes 4 that for example emit white light are surface mounted on the diode carrier.

The diode carrier 3 is a printed circuit board (PCB board) 3 of thickness e'2 of at most 0.2 mm and preferably of 0.1 mm to 0.2 mm. The diode carrier 3 extends beyond the edge face of the laminated glazing. It for example includes a diode-bearing portion, and an electrical-connection portion extending beyond the glazing and (partially) between the internal and external peripheral masking layers 15', 15. The layer 15' may be partially on the functional layer 16.

The what is called front face 30 of the diode carrier 3 bears conductive tracks facing the face F3 and the back face 30' is the side of the face F2 or face 12 against a back PVB 22 making adhesive contact with the (bare or coated) face F2, this PVB for example being thinner. Each diode 4 has an emitting face emitting in the direction of the interior glazing 1', and each diode has an edge face.

For each of the diodes, the lamination interlayer 21 therefore comprises a through aperture 20a that encircles the edge face of the diode 4 and even makes contact with this edge face or as a variant is spaced apart by at most 0.5 mm and even at most 0.1 mm from the edge face.

The diodes 4 (with a single semiconductor chip here) are of square shape of length of about 5 mm or less. The diodes are of thickness e2 smaller than the height H of the hole. The diodes do not protrude from the hole, as if they did it would risk weakening the glass by creating points of stress. Furthermore, the diodes must preferably not be spaced too far apart from the face F3, as this would risk creating too many air bubbles.

The PCB board 3 chosen is the thinnest possible, for example of 0.1 mm thickness, flexible and in the case shown here where the diodes 4 are in the vision area (outside of the periphery with the internal and external masking layers 15 and 15') even preferably the most inconspicuous possible (minimum width or even transparency), the board for example including a transparent film such as a film of PET, PEN or a polyimide and even, as regards the printed circuit, transparent connection tracks (rather than tracks made of copper or another metal, unless sufficiently thin).

The following are for example chosen during manufacture: a first sheet 21, made of PVB, with through (or blind as a variant) apertures and a second sheet 22 of PVB on the side of the back face 30' of the PCB board 3. By reflow, the two sheets are joined, the interface (here shown by the dotted line) possibly being visible.

The layer 16 may comprise a zone forming a touch on/off switch for turning on the reading light.

FIG. 1" shows a schematic partial cross sectional view of the laminated glazed roof in one variant of FIG. 1', in which:
a functional layer 17, for example a heating layer, is on face F3; and
the layer on face F4 has (optionally) been removed.

The layer 17 comprises a zone forming a touch on/off switch for turning on the reading light.
The following has been added to the carrier 3: a diode 4' forming a luminous indicator of the status of the touch-switch zone (in its associated through aperture).

FIGS. 1a, 1b, 1c, 1d and 1e show face-on views of diode carriers internal face side (oriented toward the passenger compartment) with different arrangements of diodes.

The PCB board 3 includes a diode-bearing first portion 31 and a narrower electrical-supply portion 32 leading to beyond the edge face of the roof. More specifically:
in FIG. 1a nine diodes 4 are used, eight diodes 4 in a circle forming a reading light and one central diode 4' forming a status indicator light;
in FIG. 1b diodes nine are used, eight diodes 4 in a circle forming a reading light and one central diode 4' forming a status indicator light and a portion 31 of the diode-bearing carrier is apertured for greater inconspicuousness;
in FIG. 1c fifteen diodes are used, fourteen diodes 4 in a square forming a reading light and one central diode 4' forming a status indicator light;
in FIG. 1d seventeen diodes are used, sixteen diodes 4 in a cross forming a reading light and one central diode 4' forming a status indicator light;
in FIG. 1e a row of six diodes 4 has been used and for example the carrier 3 contains an L-shaped dogleg, an adhesive 6 forming a seal if against face F2 and the connecting portion 32 extends beyond the edge face 10.

FIGS. 1i, 1j, 1k, 1l, 1m, 1n and 1o show schematic partial exploded cross sectional views of the luminous laminated glazed roof according to the invention, illustrating manufacturing processes involving a preferably transparent, flexible and thin (less than 0.2 mm thick) diode carrier 3 with a front face 30 against a face of a PVB sheet with the through apertures 20a (or the blind holes) and a back face 30' toward the face F2. The carrier 3 extends beyond the edge face 10 of the laminated glazing.

In FIG. 1i, a single PVB sheet 21 with the through apertures or as a variant the blind holes, said sheet possibly being a conventional and/or acoustic and/or tinted PVB sheet, has been used.

In FIG. 1j, the following have been used:
a first PVB sheet 21 with the through apertures or as a variant the blind holes, said sheet possibly being a conventional and/or acoustic and/or tinted PVB sheet, has been used, the local apertures preferably being wider than the diodes 4, 4' before lamination;
and a second PVB sheet 22, on the side of the back face of the carrier 3, said sheet possibly being a for example tinted conventional PVB sheet that is thinner than the first sheet 21 (the latter allowing for the thickness of the diodes).

In FIG. 1k, the following have been used:
a first PVB sheet 21 with the through (or blind or a variant) apertures, said sheet possibly being a conventional and/or acoustic and/or tinted PVB sheet;
a preferably flexible transparent (PET, etc.) film 3', for example of 10 to 100 µm thickness, bearing a functional layer 33' face F2 (or face F3 as a variant) side, for example a low-emissivity or solar-control film, here for example preassembled with the sheet 21 and/or alternatively another PVB sheet 23 (that is for example thinner than the first sheet) face F3 side, said film 3' having essentially the same area as the faces F2 and F3.

The transparent film is for example preassembled with the first sheet 21 and the other sheet 23 before the through or preferably blind apertures are produced in the thickness of the PVB sheet 21, rather than in the thickness of the PVB sheet 21/PET film conductor or even the PVB sheet 23.

It is preferable for the layer 33' to be unapertured and therefore away from (not pierced or touched by the holes) the blind holes, which are then in the PVB sheet 21. The layer 33' may be face F2 or face F3 side.

In FIG. 1l or 1m, the following have been used:

a first PVB sheet 21 with the through apertures, said sheet possibly being a conventional and/or acoustic and/or tinted PVB sheet;

locally, on the periphery, a transparent (PET etc.) film 3 bearing a functional layer face F3 (or face F2 as a variant) side, for example forming a capacitive touch on/off switch (for turning on the diodes 4 forming the reading light); and another PVB sheet 23 (that is thinner than the first sheet, FIG. 1*l*) face F3 side or alternatively an adhesive 6' bonding the film 3' (FIG. 1*m*).

In FIG. 1*n*, the following have been used:

a first PVB sheet 21 with the through apertures, said sheet possibly being a conventional and/or acoustic and/or tinted PVB sheet;

and a second PVB sheet 22 face F2 side, said sheet possibly being a for example tinted conventional PVB sheet that is optionally thinner than the first sheet (the latter allowing for the thickness of the diodes); and the diodes 4 are reverse-mount diodes, i.e. the light passes through the carrier 3 which is (drilled if necessary) against or adhesively bonded to face F3.

In FIG. 1*o*, a first PVB sheet 21 with the apertures forming blind holes 20*i*, said sheet possibly being a conventional and/or acoustic PVB sheet, has been used.

FIG. 1*bis* shows a schematic partial exploded cross sectional view of the laminated glazed roof, according to one embodiment of the invention.

It differs from that shown in FIG. 1' in that the through aperture 20*a* of the PVB sheet 21 is common to the diodes and a spacer 50 is between the diodes 4. As a variant, the common aperture is blind.

FIG. 2 shows a schematic partial cross sectional detail view of the laminated glazed roof 200' according to one embodiment of the invention.

Each diode, preferably a power diode for a reading light, is an electronic component including a semiconductor chip 41, and is equipped with a polymeric or ceramic peripheral package 42 encapsulating the edge face of the electronic component.

The lamination interlayer (by reflow during lamination) may spread as far as to between the what is called front surface 42' of the package and the face F3 without however spreading as far as to the front face 40 of the diode (emitting face of the chip or more precisely face of the assembly consisting of the chip and the encapsulating material 43, which has a protective or wavelength-converting function (luminophore)). The package may have a profile 42*a* that flares with distance from the chip 41.

The electronic component 4 thus generally includes a support 42*b*, here what is called a lower portion of the package bearing the semiconductor chip and a reflector that is flared toward face F3, here an upper portion 42*a* of the package.

The material 43 may be a transparent resin and/or a resin mixed with a luminophore.

The luminophore may be just on the chip 41. The material 43 may be below flush with the surface (of the reflector) 42*a*, in particular creating an air gap that may be useful.

Examples of diodes are described in the document "Les LEDs pour l'éclairage" by Laurent Massol, Edition Dunod, on pages 140 and 141.

The lamination interlayer may spread as far as to be between said front surface 42' of the package and the face F3 without making contact with the emitting face of the chip or the surface 40.

The package is for example made of epoxy or a ceramic. A polymeric package may optionally be compressed (the final thickness after lamination may be smaller than the initial thickness) during the lamination. The (polymeric) package may be opaque.

On the back face of the diode (of the package), there are two areas 44 of electrical contact with zones 33 (isolated by an etch 33' etc.) of an electrically conductive layer 33 on the carrier 3.

FIG. 2' shows a schematic partial cross sectional detail view of the laminated glazed roof according to one embodiment of the invention, which differs from FIG. 2 in that the back PVB sheet 22 (against face F2) has been removed and replaced by a glue 6.

FIG. 3 shows a schematic partial cross sectional detail view of the laminated glazing roof according to one embodiment of the invention, which differs from FIG. 2 in that the back PVB sheet (against face F2) has been removed, as indeed has the diode carrier, the (electrical) connections being on face F2 and taking the form of an, in particular transparent, electrically conductive layer 18 (electrically conductive zones isolated by an isolating device 18', for example an insulating strip 18' of sub-millimeter-sized width that is for example formed by laser etching). As a variant, the aperture is blind.

FIG. 4*a* shows a schematic partial cross sectional detail view of the laminated glazed roof according to one embodiment of the invention, which differs from FIG. 1*e* in that the diodes 4 are reverse-mount diodes and therefore the diode carrier 3 is face F3 side (adhesively bonded via an adhesive to face F3) and the contacts 44 are connected by lateral contacts 45, such as metal fins, to the connection tracks 33*a*, 33*b* back face (toward F2) side of the carrier. The carrier 3 may be drilled, with a through hole 5', in order to (better) let pass the light.

FIGS. 4*b* and 4*c* are a bottom view and a perspective view, respectively, of examples of reverse-mount diodes 4.

FIG. 5*a* shows a schematic partial cross sectional detail view of the laminated glazed roof according to one variant of the embodiment of the invention of FIG. 4*a*, in which the diode carrier has been removed and the contacts 44 are connected by lateral contacts 45, such as metal fins, to the isolated (with their isolating device 18') connecting tracks 18 on face F3, for example a (transparent) electrically conductive layer 18 made up of at least two zones isolated by an insulating strip 18'. It may be an electrically conductive layer covering the face F3 and furthermore having a heating and/or solar-control layer function.

FIG. 6*a* shows a schematic partial cross sectional detail view of the laminated glazed roof according to a variant of the embodiment of the invention of FIG. 4*a*, in which the front face of the carrier 3 is laminated to face F3 by a PVB sheet 22 that also preferably contains a through aperture.

The invention claimed is:

1. A luminous laminated glazed roof for a vehicle, said roof comprising:
    a laminated glazing including:
        a first transparent glazing, made of mineral glass, with first and second main faces, which first transparent glazing is intended to be an exterior glazing;
        a second transparent glazing made of mineral glass, with third and fourth main faces, which second transparent glazing is intended to be an interior glazing;
        between the second and third main faces, which are internal faces of the laminated glazing, a transparent lamination interlayer film made of thermoplastic polymeric material, the lamination interlayer film having a fifth main face oriented toward the second main face and a sixth main face oriented toward the third main face; and at least one inorganic light-emitting diode, each inorganic light-emitting diode including at least one semiconductor chip, each inorganic light-emitting diode being able to emit in a direction of the third main face;

wherein said lamination interlayer is provided, between the fifth main face and the sixth main face, with one or more apertures that are through apertures or that form blind holes, each inorganic light-emitting diode being of sub-millimeter-sized thickness and being housed in a through aperture or a blind hole;

wherein each inorganic light-emitting diode is associated with a through aperture or a blind hole encircling the edge face of the inorganic light-emitting diode, or wherein at least one group of said inorganic light-emitting diodes is associated with a common, through aperture or a common, blind hole, wherein a group of said diodes is associated with a common through aperture or a common blind hole and wherein a diode carrier has a back face pressed against or adhesively bonded to the second main face or the third main face, the inorganic light-emitting diodes being reverse-mount diodes, and a front face with the group of diodes makes contact with the fifth main face or the sixth main face, the inorganic light-emitting diodes being reverse-mount diodes.

2. A luminous laminated glazed roof for a vehicle, said roof comprising:

a laminated glazing including:

a first transparent glazing, made of mineral glass, with first and second main faces, which first transparent glazing is intended to be an exterior glazing;

a second transparent glazing made of mineral glass, with third and fourth main faces, which second transparent glazing is intended to be an interior glazing;

between the second and third main faces, which are internal faces of the laminated glazing, a transparent lamination interlayer film made of thermoplastic polymeric material, the lamination interlayer film having a fifth main face oriented toward the second main face and a sixth main face oriented toward the third main face; and a plurality of inorganic light-emitting diodes, each inorganic light-emitting diode including at least one semiconductor chip, each inorganic light-emitting diode being able to emit in a direction of the third main face;

wherein said lamination interlayer is provided, between the fifth main face and the sixth main face, with one or more apertures that are through apertures or that form blind holes, each inorganic light-emitting diode being of sub-millimeter-sized thickness and being housed in a through aperture or a blind hole;

wherein the lamination interlayer includes one or more sheets of thermoplastic polymeric material, and wherein each inorganic light-emitting diode is associated with a through aperture or a blind hole formed in a main face of a first sheet of said one or more sheets of thermoplastic polymeric material so that the through aperture or blind hole receives a single one of the plurality of inorganic light-emitting diodes, said through aperture or blind hole encircling the edge face of the inorganic light-emitting diode, the luminous laminated glazed roof further including a flexible diode carrier to support said plurality of inorganic light-emitting diodes, said flexible diode carrier including a front face on which said plurality of inorganic light-emitting diodes are mounted, said front face extending along part of, and being positioned against, the main face of said first sheet of said one or more sheets.

3. The vehicular luminous laminated glazed roof as claimed in claim 2, wherein each inorganic light-emitting diode is an electronic component equipped with a peripheral package encapsulating an edge face of the electronic component.

4. The vehicular luminous laminated glazed roof as claimed in claim 2, wherein the flexible diode carrier is pressed against or adhesively bonded to the second main face or the third main face, the inorganic light-emitting diodes being reverse-mount diodes, said diode carrier being of thickness that is at most 0.15 mm, and wherein the diode carrier extends beyond the edge face of the laminated glazing, and a narrower electrical supply portion of the diode carrier extending beyond the edge face of the laminated glazing, or wherein the plurality of inorganic light-emitting diodes are on the second main face or are reverse mounted on the third main face.

5. The vehicular luminous laminated glazed roof as claimed in claim 4, wherein the diode carrier includes a diode-bearing first portion that is apertured.

6. The vehicular luminous laminated glazed roof according as claimed in claim 4, wherein the one or more sheets of thermoplastic polymeric material include a second sheet made of thermoplastic material between a back face of the diode carrier and the second main face or the third main face, the inorganic light-emitting diodes being reverse-mount diodes.

7. The vehicular luminous laminated glazed roof as claimed in claim 2, wherein the through aperture or the blind hole is in a thickness of a PVB sheet that forms said first sheet.

8. The vehicular luminous laminated glazed roof as claimed in claim 2, wherein the through aperture or the blind hole is in a thickness of an acoustic lamination interlayer that forms said first sheet.

9. The vehicular luminous laminated glazed roof as claimed in claim 2, wherein the through aperture or the blind hole is in a composite material consisting of: a PVB sheet/transparent plastic film or a PVB sheet/transparent plastic film/PVB sheet, said plastic film a low-emissivity or solar control and/or heating functional coating.

10. The vehicular luminous laminated glazed roof as claimed in claim 2, wherein the diode carrier includes a transparent film made of plastic material and an electrical circuit is provided with conductive tracks.

11. The vehicular luminous laminated glazed roof as claimed in claim 2, wherein the diode carrier extends at least as far as to the edge face of the laminated glazing, and between a back face of the diode carrier and the second main face or the third main face, the plurality of inorganic light emitting diodes being reverse-mount diodes, is housed an adhesive that is impermeable to liquid water, of thickness of at most 0.1 mm.

12. The vehicular luminous laminated glazed roof as claimed in claim 2, wherein the diode carrier essentially covers the second and third main faces.

13. The vehicular luminous laminated glazed roof as claimed in claim 2, wherein the plurality of inorganic light emitting diodes form a reading light.

14. The vehicular luminous laminated glazed roof as claimed in claim 2, wherein the plurality of inorganic light-emitting diodes forms an indicator light of a remote, touch on/off switch oriented toward the third main face.

15. A vehicle including at least one luminous laminated glazed roof as claimed in claim 2.

16. A process for manufacturing the luminous laminated glazed roof as claimed in claim 2, comprising:
cutting a single sheet of an acoustic and/or tinted PVB or a composite sheet consisting of a PVB sheet/film of functional plastic or of a PVB sheet/film of functional plastic/PVB sheet to form local blind or through apertures; and
assembling the laminated glazing, with the plurality of inorganic light-emitting diodes housed in the apertures.

17. The process for manufacturing the luminous laminated glazed roof as claimed in claim 16, wherein each aperture is blind and is produced in one of the PVB sheets of the composite sheet consisting of a PVB sheet/plastic functional film bearing the functional coating/PVB sheet without touching said functional coating or the plastic functional film.

18. The process for manufacturing the luminous laminated glazed roof as claimed in claim 16, wherein the plurality of inorganic light-emitting diodes are surface mount devices that are mounted on the diode carrier or toward the second main face if the diodes are reverse-mount diodes.

19. The process for manufacturing the luminous laminated glazed roof as claimed in claim 18, wherein the sheet or the composite sheet is the first sheet and a thermoplastic second sheet is between the back face of the diode carrier and the second main face or the third main face if the plurality of inorganic light-emitting diodes are reverse-mount diodes.

20. A process for manufacturing the luminous laminated glazed roof as claimed in claim 19, wherein, by reflow, the lamination interlayer with the one or more apertures that are wider than the plurality of inorganic light-emitting diodes spreads as far as to make contact with the edge face of the plurality of inorganic light-emitting diodes and wherein, for each through aperture, spreads as far as to be between said front surface of the package of the plurality of inorganic light-emitting diodes and the third main face without spreading as far as to make contact with the emitting face of the chip.

* * * * *